United States Patent
Aryal et al.

(10) Patent No.: US 12,444,606 B2
(45) Date of Patent: Oct. 14, 2025

(54) METHODS FOR FORMING VERTICALLY LAYERED IONIC LIQUID CRYSTAL (ILC) STRUCTURES ON A SEMICONDUCTOR SUBSTRATE

(71) Applicant: Tokyo Electron Limited, Tokyo (JP)

(72) Inventors: Dipak Aryal, Austin, TX (US); Antonio Luis Pacheco Rotondaro, Austin, TX (US); Takeo Nakano, Nirasaki (JP); Mitsuaki Iwashita, Nirasaki (JP); Ryuichi Asako, Nirasaki (JP); Tamotsu Morimoto, Nirasaki (JP); Paul Abel, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 244 days.

(21) Appl. No.: 18/388,240

(22) Filed: Nov. 9, 2023

(65) Prior Publication Data

US 2025/0157820 A1    May 15, 2025

(51) Int. Cl.
*H01L 21/033* (2006.01)
*C09K 19/04* (2006.01)

(52) U.S. Cl.
CPC .......... *H01L 21/0337* (2013.01); *C09K 19/04* (2013.01); *H01L 21/0332* (2013.01); *H01L 21/0335* (2013.01)

(58) Field of Classification Search
None
See application file for complete search history.

(56) References Cited

U.S. PATENT DOCUMENTS

| | | | |
|---|---|---|---|
| 8,048,795 B2 | 11/2011 | Lee et al. | |
| 8,669,645 B2 | 3/2014 | Millward et al. | |
| 8,900,963 B2 | 12/2014 | Sills et al. | |
| 12,398,324 B1* | 8/2025 | Aryal | C07F 5/022 |
| 2004/0235199 A1 | 11/2004 | Jung et al. | |
| 2019/0211130 A1 | 7/2019 | Morita et al. | |
| 2019/0278172 A1 | 9/2019 | Lee et al. | |
| 2023/0036175 A1 | 2/2023 | Arnold et al. | |

OTHER PUBLICATIONS

Kapernaum et al., "Current Topics in Ionic Liquid Crystals", Chemistry Europe, ChemPlusChem, 2022, 38 pgs.
Saielli, "Comparison of the Ionic Liquid Crystal Phase of [C12C1im][BF4] and [C12c1im]C1 By Atomistic MD Simulations", Crystals, MDPI, Mar. 2020, 10 pgs.
Renier et al., "Developing Design Tools for Introducing and Tuning Structural Order in Ionic Liquids", Royal Society of Chemistry, CrystEngComm, 2021, 11 pgs.

(Continued)

*Primary Examiner* — Roberts P Culbert
(74) *Attorney, Agent, or Firm* — Egan, Enders & Huston LLP.

(57) ABSTRACT

Embodiments of improved methods and processes are provided for patterning a semiconductor substrate using direct self-assembly (DSA) of ionic liquid crystals (ILCs). In the disclosed embodiments, an ILC solution comprising ILCs is deposited on a variety of substrate surfaces. An upper surface of the ILC solution is exposed to a gas phase, non-polar solvent (such as, e.g., hexane gas). The gas phase, non-polar solvent provides an ambient environment that promotes self-assembly of the ILCs into vertically layered ILC structures.

20 Claims, 8 Drawing Sheets

(56) References Cited

OTHER PUBLICATIONS

Pulukkody et al., "Mesomorphism of Imidazolium-Based Fluorinated Ionic Liquids", Journal of Ionic Liquids, 2024, 8 pgs.
Wang et al., "Regulating The Mesogenic Properties of Imidazolium Salts By Modifying N3-Substituents", Science China Chemistry, vol. 58, No. 12, 2015, 7 pgs.
Kloos et al., "Self-Assembling Liquid Crystals as Building Blocks to Design Nanoporous Membranes Suitable for Molecular Separations", Journal of Membrane Science, 2021, 18 pgs.
Nickmans et al., "Directed Self-Assembly of Liquid-Crystalline Molecular Building Blocks For Sub-5 nm Nanopatterning", Advanced Materials, Progress Report, Adv. Mater. 2018, 16 pgs.
Hayashi et al., "Discovery of a Magnetic Ionic Liquid [bmim]FeCi4", Chemistry Letters vol. 33, No. 12, 2004, 2 pgs.
Fernandez et al., "Key Developments in Ionic Liquid Crystals", International Journal of Molecular Sciences, 2016, 31 pgs.
Pinto-Gomez et al., "Directed Self-Assembly of Block Copolymers for the Fabrication of Functional Devices", MDPI, 2020, 21 pgs.
Zhong et al., "Syntheses, Structures, and Properties of a Series of Metal Ion-Containing Dialkylimidazolium Ionic Liquids", The Chemical Society of Japan, 2007, 11 pgs.
Konwar et al., "Transition Metal Containing Ionic Liquid-Assisted One-Pot Synthesis of Pyrazoles at Room Temperature", J. Chem. Sci., 2019, 9 pgs.
Ding et al., "Transition Metal-Containing Ionic Liquid Crystals With 1-Decyl-2, 3-Dimethylimidazolium; Facile Syntheses, Crystal Structures, Thermal Properties and NH3 Detection", Wiley-VCH, Chemistry-Europe on Line Library, 2018, 7 pgs.
The International Search Report and the Written Opinion, PCT/US2024/046016, Dec. 16, 2024, 9 pgs.

\* cited by examiner

METHODS FOR FORMING VERTICALLY LAYERED IONIC LIQUID CRYSTAL (ILC) STRUCTURES ON A SEMICONDUCTOR SUBSTRATE

RELATED APPLICATION DATA

This application is related to U.S. patent application Ser. No. 18/388,222, filed Nov. 9, 2023, is entitled "Methods for Patterning a Semiconductor Substrate Using Metalate Salt Ionic Liquid Crystals;" the disclosure of which is expressly incorporated herein, in its entirety, by reference.

TECHNICAL FIELD

The present disclosure relates to the processing of semiconductor substrates. In particular, it provides improved methods and processes for patterning semiconductor substrates using direct self-assembly (DSA) of ionic liquid crystals (ILCs).

BACKGROUND

Semiconductor devices, such as integrated circuits (ICs), are fabricated by sequentially depositing and patterning layers of dielectric, conductive, and semiconductor materials over a semiconductor substrate to form a network of electronic components and interconnect elements (e.g., transistors, resistors, capacitors, metal lines, contacts, and vias), which are integrated in a monolithic structure. At each successive technology node, the minimum feature sizes are shrunk to reduce cost by roughly doubling the component packing density.

A common patterning method uses a photolithography process, which includes photoresist coating, exposure and development steps, to form a desired pattern on a substrate surface that can be transferred to an underlying layer. In conventional photolithography processes, a substrate surface is coated with a light-sensitive photoresist film and exposed to light to convert exposed portions of the light-sensitive photoresist film to a reacted photoresist. After exposure, a developing step is performed to remove the reacted (or unreacted) portion of the photoresist film for patterning, thus providing a photoresist pattern on the substrate.

In this technique, the resolution of the optical system used to perform the lithography step limits the minimum feature size that can be patterned with acceptable control and the minimum pitch between the features in the pattern. According to the Rayleigh criterion, the minimum feature size is proportional to the wavelength ($\lambda$) of light used for imaging, and inversely proportional to the numerical aperture (NA) of the projection lens. Over time, shorter wavelengths of light—from visible wavelengths (436 nm) to UV (365 nm), deep-UV (248 and 193 nm) and extreme-UV (EUV, 13.5 nm) wavelengths—have been utilized to reduce the feature size and pitch obtainable for advanced technology nodes. Today, EUV lithography is commonly used at the industry level for advanced patterning at 10 nm, 7 nm and 5 nm technology nodes.

As feature sizes continue to scale below 5 nm, it becomes desirable to produce patterns with critical dimensions (CDs) smaller than the wavelengths of light widely available for industrial applications. This requires new pattern-transfer methods, since the resolution of the optical system remains limited by the wavelength ($\lambda$) of light used for imaging. One method for achieving suitable photolithography for increasingly smaller CDs is to use a multi-patterning technique for pitch splitting or pitch multiplication. Examples of multi-patterning techniques include self-aligned double patterning (SADP), self-aligned triple patterning (SATP) and self-aligned quadruple patterning (SAQP). These multi-patterning techniques involve the utilization of sidewall spacers, fill layers and selective etching for defining structures at pitches, which are less than the original photolithography pitch.

Direct self-assembly (DSA) of polymers and other small molecules has recently been investigated as another pitch multiplier for pattern transfer technology. In these methods, large templates are patterned to direct the molecular self-assembly of polymers or other small molecules, which self-assemble within the larger template to produce substantially smaller pitch patterns. The self-assembled patterns are then used as the template for pattern transfer.

DSA of block copolymers (BCPs) has been widely investigated as a pitch multiplier for pattern-transfer technology, due to its high resolution, low cost and ease of integration and scalability. BCPs are macromolecules consisting of covalently bonded homogeneous blocks (or chains) of chemically different monomers. Due to the dis-affinity and repulsion forces between these blocks, BCPs phase segregate into microdomains to generate self-assembled patterns within the nano/microscale domain. After self-assembly, one of the blocks is removed and the remaining polymer is used as mask to pattern the underlying substrate.

Although DSA of block copolymers has received much attention, there are several issues preventing their integration into the semiconductor patterning process. First, since the characteristic dimensions of BCPs are controlled by the molecular weight of the polymer, the minimum pitch that can be achieved through BCP self-assembly is currently limited to 10 nm. Thus, DSA of block copolymers cannot be used as a pitch multiplier for pattern transfer at sub-10 nm feature sizes. Second, BCPs are soft organic building blocks that have a tendency to form arbitrarily oriented poly-domain structures when left unguided. This prevents their use in pattern transfer technology.

Ionic liquid crystals (ILCs) have recently been proposed as another class of materials for molecular self-assembly. Ionic liquid crystals are salts having properties of ionic liquids (ILs) and liquid crystals (LCs). FIG. 1A shows a mapping of coarse grain (CG) particles within an example ILC molecule 100. As shown in FIG. 1A, the ILC molecule 100 (e.g., 1-dodecyl-3-methylimidazolium tetrafluoroborate) contains a cation head group (e.g., an imidazolium-based cation) covalently bound to an elongated alkyl tail group and an anion (e.g., tetrafluoroborate, $BF_4^-$). Due to the difference in polarity between the ionic groups, ILCs spontaneously segregate into ordered phases (otherwise referred to as ordered structures) at or near room temperature.

FIG. 1B shows one example of an ordered structure formed by direct self-assembly of the ILC molecules shown in FIG. 1A. One dominant phase of the self-assembled ILC is a lamellar structure 110 of alternating distinct layers. As shown in FIG. 1B, the lamellar structure 110 includes a first distinct layer 120 (approximately 1 nm wide) containing the cation head groups and anions of the ILCs, and a second distinct layer 130 (approximately 2 nm wide) containing the interdigitated alkyl tail groups of the ILCs. The layer pitch (p) between the alternating layers of the lamellar structure 110 is equal to the combined width (approximately 3 nm) of the head and tail groups of the self-assembled ILCs. Although other phases may be formed, the lamellar structure 110 shown in FIG. 1B (otherwise referred to herein as a layered structure) may be particularly useful in the patterning of features on a substrate at sub-5 nm pitch.

Similar to block copolymers, ILCs self-assemble into ordered structures, albeit at a much smaller scale. The ordered structures produced by self-assembled ILCs can be used for pitch multiplication in pattern transfer methods, as long as the self-assembly pattern can be transferred to the underlying substrate. However, the use of ILCs in pattern transfer technology remains challenging. The first challenge is to produce vertically layered patterns of ILCs on the substrate surface. The second challenge is to transfer the vertically layered patterns to the underlying substrate. New methods and processes are needed to overcome these challenges.

SUMMARY

The present disclosure provides various embodiments of improved methods and processes for patterning a semiconductor substrate using direct self-assembly (DSA) of ionic liquid crystals (ILCs). In the disclosed embodiments, an ILC solution comprising ILCs is deposited on a variety of substrate surfaces. An upper surface of the ILC solution is exposed to a gas phase, non-polar solvent (such as, e.g., hexane gas) at a predetermined gas pressure. The gas phase, non-polar solvent provides an ambient environment that promotes self-assembly of the ILCs into vertically layered ILC structures.

According to one embodiment, a method is provided herein to pattern a semiconductor substrate. The method may generally include depositing an ionic liquid crystal (ILC) solution on a surface of the semiconductor substrate and exposing an upper surface of the ILC solution to a gas phase, non-polar solvent. The ILC solution deposited on the surface includes ionic liquid crystals (ILCs) having cation head groups, alkyl tail groups and anions. The gas phase, non-polar solvent promotes self-assembly of the ILCs into a vertically layered structure on the surface of the semiconductor substate. The vertically layered structure has alternating layers of head group layers and tail group layers, with the anions segregated to the head group layers. After self-assembly, the method may utilize the vertically layered structure to form the pattern on the semiconductor substrate.

In some embodiments, the method may deposit the ILC solution on a periodic substrate surface comprising alternating hydrophilic surface layers and hydrophobic surface layers. In such embodiments, the gas phase, non-polar solvent may enable the ILCs to self-assemble into a vertically layered structure on the periodic substrate surface with the head group layers and anions vertically aligned with the hydrophilic surface layers and the tail group layers vertically aligned with the hydrophobic surface layers.

In other embodiments, the method may deposit the ILC solution within at least one feature formed on the semiconductor substrate, wherein the at least one feature has a neutral bottom surface and hydrophilic sidewall surfaces. In such embodiments, the gas phase, non-polar solvent may enable the ILCs to self-assemble into a vertically layered structure within the at least one feature, wherein the head group layers of the vertically layered structures are oriented towards the hydrophilic sidewall surfaces of the at least one feature.

Another method is provided to pattern a semiconductor substrate in accordance with another embodiment of the present disclosure. The method may generally include depositing an ionic liquid crystal (ILC) solution on a periodic surface of the semiconductor substrate and exposing an upper surface of the ILC solution to a gas phase, non-polar solvent. The ILC solution deposited on the periodic surface may generally include ionic liquid crystals (ILCs) having cation head groups, alkyl tail groups and anions. The periodic surface upon which the ILC solution is deposited may include alternating hydrophilic surface layers and hydrophobic surface layers. The gas phase, non-polar solvent promotes self-assembly of the ILCs into a vertically layered structure having alternating layers of head group layers and tail group layers, with the anions segregated to the head group layers, by providing an ambient environment that enables: (a) the head group layers to vertically align with the hydrophilic surface layers of the periodic surface, and (b) the tail group layers to vertically align with the hydrophobic surface layers of the periodic surface. After self-assembly, the method may utilize the vertically layered structure to form a pattern on the semiconductor substrate.

The methods disclosed herein utilize direct self-assembly of ILC molecules to form vertically layered ILC structures on various substrate surfaces. In the disclosed embodiments, an ILC solution is exposed to a gas phase, non-polar solvent at a predetermined gas pressure to provide an ambient environment that promotes self-assembly of ILCs into vertically layered ILC structures. The predetermined gas pressure may generally be greater than 1 atmosphere (atm). In some embodiments, vertically layered ILC structures may be formed by exposing the ILC solution to a gas phase, non-polar solvent at gas pressure ranging between about 2 atm to about 3 atm.

In the methods disclosed herein, an ILC solution comprising ionic liquid crystals is deposited onto a substrate surface. The ILC solution may include a wide variety of ILCs having various cation head groups, alkyl tail groups and anions. For example, the ILCs may include an imidazolium, pyrazolium, pyrrolidinium, pyridinium, piperidinium, morpholinium, ammonium, phosphonium, sulphonium or cholinium-based cation head groups. In some embodiments, the ILCs may include an imidazolium-based cation head group of the form: 1-$R_1$-3-$R_2$-imidazolium, where $R_1$ is an alkyl chain with a chain length ranging from 8-18 carbons, and $R_2$ is a hydrogen, methyl, ethyl, propyl, butyl, substituted or unsubstituted phenyl, or other hydrocarbon group. In example embodiments, the ILCs may be synthesized by combining 1-dodecyl-3-methylimidazolium-based ILCs with an appropriate anion.

A wide variety of anions can be used to form the ILCs used herein. In some embodiments, the anions may be selected from a group of anions comprising: tetrafluoroborate ($BF_4^-$), chloride ($Cl^-$), acetate ($CH_3COO^-$), hexafluorophosphate ($PF_6^-$), trifluoromethyl acetate ($C_3H_3F_3O_2^-$), nitrate ($NO_3^-$), dicyanamide ($C_2HN_3^-$), tetracyanoborate ($B(CN)_4^-$), trifluoromethane sulfonate ($CF_3O_3S^-$) and bis((trifluoromethyl)sulfonyl)imdide ($[(CF_3SO_2)_2N]^-$). In other embodiments, the anions may be selected from a group of metalate anions comprising: chloroaluminate anions, chloroferrate anions, chlorostannate anions, chloroindate anions and chlorozincate anions. In some embodiments, 1-dodecyl-3-methylimidazolium-based ILCs may be combined with a metalate anion to form metalate salt ILCs.

The methods disclosed herein may expose the upper surface of the ILC solution to a wide variety of gas phase, non-polar solvents. In some embodiments, the upper surface of the ILC solution may be exposed to hexane ($C_6H_{14}$) gas, cyclohexane ($C_6H_{12}$) gas, pentane ($C_5H_{12}$) gas, heptane ($C_7H_{16}$) gas or another gas phase alkane. In other embodiments, the upper surface of the ILC solution may be exposed to benzene ($C_6H_6$) gas, toluene ($C_6H_5CH_3$) gas, xylene ($C_8H_{10}$) gas or another gas phase aromatic hydrocarbon. Other gas phase, non-polar solvents not specifically mentioned herein may also be used. Because the gas phase, non-polar solvent is neither attracted to or repelled by the polar molecules of the ILCs, the gas phase, non-polar solvent provides an ambient environment that promotes self-assembly of the ILCs into the vertically layered structure having alternating layers of head group layers and tail group layers, with the anions segregated to the head group layers.

In some embodiments, the methods disclosed herein may utilize the vertically layered structure to form the pattern on the semiconductor substrate. For example, the ILC solution deposited onto the substrate surface may include metalate salt ILCs. When deposited onto the substrate surface in the presence of a gas phase, non-polar solvent, the head and tail groups of the metalate salt ILCs may segregate and self-assemble into a vertically layered metalate salt ILC structure with the metalate anions segregated to the head group layers.

After self-assembly, the substrate may be exposed to an oxidation process to remove the tail group layers from the vertically layered metalate salt ILC structure and convert the head group layers of the vertically layered metalate salt ILC structure into a metal oxide pattern. For example, the substrate may be exposed to an oxygen plasma ashing process, an ultra-violet (UV) ozone process, a gas phase oxidation process or a solution phase oxidation process. The oxidation process removes the alkyl tail group layers from the vertically layered metalate salt ILC structure by converting the organic material within the alkyl tail group layers into volatile carbon oxides, which are removed from the substrate surface during the oxidation process. However, the metalate anions within the head group layers are converted into non-volatile metal oxides, which are left on the substrate surface after oxidation. In doing so, the oxidation process volatizes the ionic liquid crystal layer, but leaves behind a metal oxide pattern where the metalate anions were concentrated. The metal oxide pattern left on the substrate surface is more robust than the ILC film, and as such, can be used as a hard mask for pattern transfer to underlying layer(s).

As noted above and described further herein, the present disclosure provides various embodiments of methods for patterning a semiconductor substrate using direct self-assembly of ILC molecules to form vertically layered ILC structures on various substrate surfaces. Of course, the order of discussion of the different steps as described herein has been presented for the sake of clarity. In general, these steps can be performed in any suitable order. Additionally, although each of the different features, techniques, configurations, etc., herein may be discussed in different places of this disclosure, it is intended that each of the concepts can be executed independently of each other or in combination with each other. Accordingly, the present invention can be embodied and viewed in many different ways.

Note that this Summary section does not specify every embodiment and/or incrementally novel aspect of the present disclosure or claimed inventions. Instead, the summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

The present disclosure provides various embodiments of improved methods and processes for patterning a semiconductor substrate using direct self-assembly (DSA) of ionic liquid crystals (ILCs). In the disclosed embodiments, an ILC solution comprising ILCs is deposited on a variety of substrate surfaces. An upper surface of the ILC solution is exposed to a gas phase, non-polar solvent (such as, e.g., hexane gas) at a predetermined gas pressure. The gas phase, non-polar solvent provides an ambient environment that promotes self-assembly of the ILCs into vertically layered ILC structures.

Similar to block copolymers, the ordered structures of ionic liquid crystals can be controlled by the chain length of the alkyl tails, balance of electrostatic and van der Waals interactions, temperatures and interactions with substrate. For example, the periodicity between the ordered structures, or pitch, can be controlled by modulating the chain length of the alkyl tails. The orientation of the ordered structures is also highly influenced by the hydrophobicity of the guide surfaces, such as the underlying substrate surface and/or sidewalls of the larger template pattern.

Figure 1A:
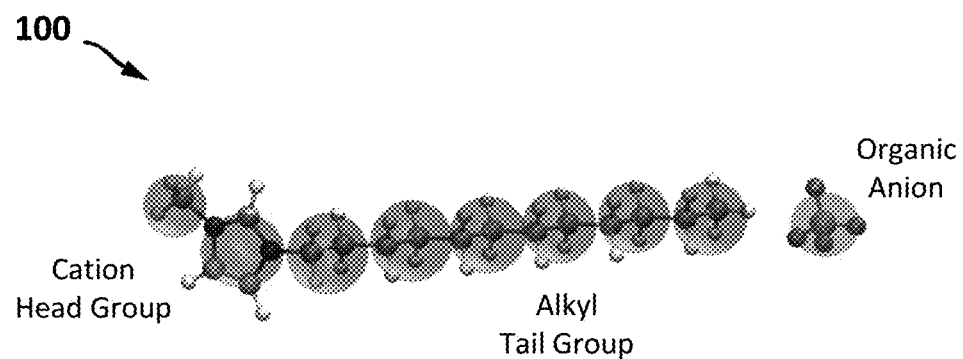
FIG. 1A is a mapping of coarse grain (CG) particles of an example ionic liquid crystal (ILC).
Figure 1B:
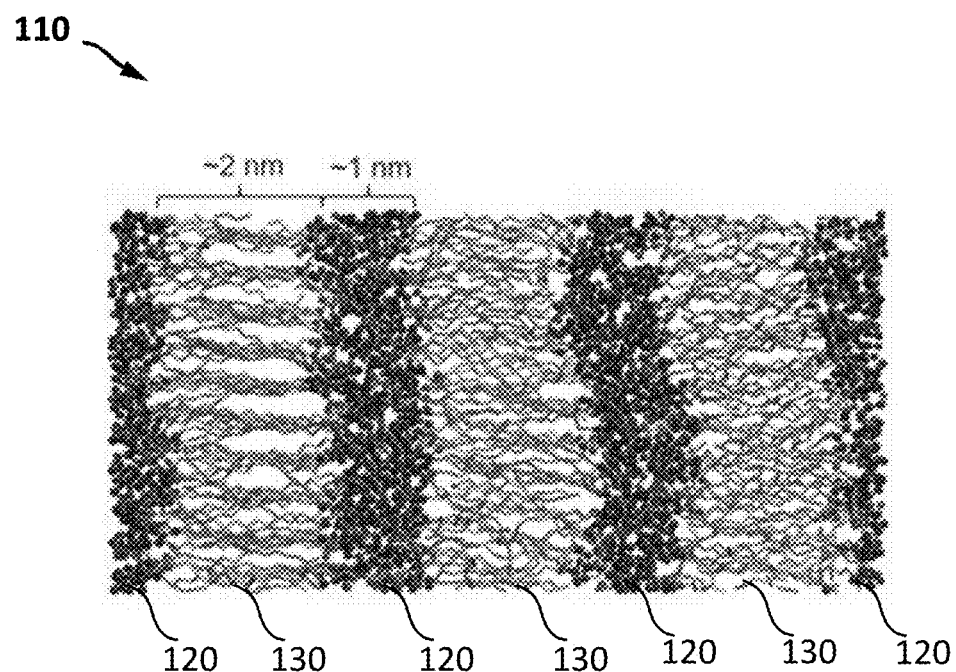
FIG. 1B illustrates one example of an ordered structure formed by direct self-assembly (DSA) of an ILC at room temperature.
Figure 2A:
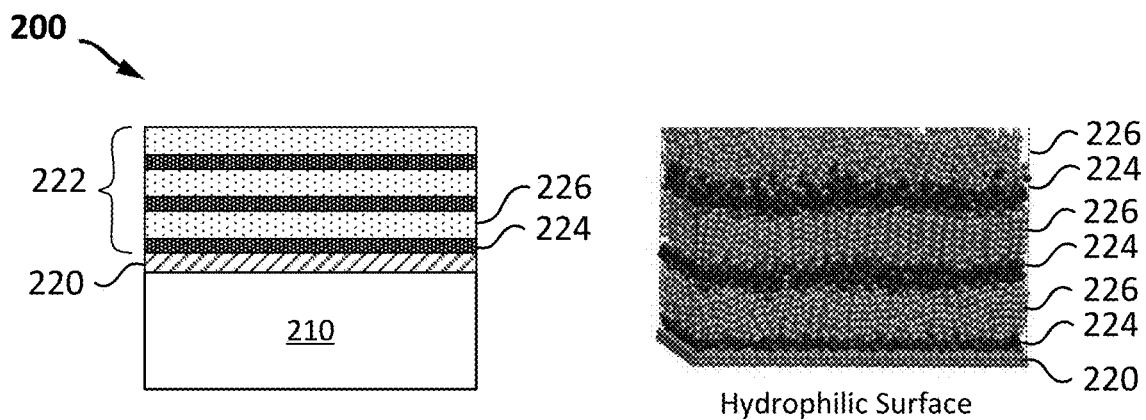
FIGS. 2(a)-(c) provide course-grain simulations showing that DSA of ILCs can be controlled by modulating the hydrophobicity of guide surfaces.
Figure 2B:
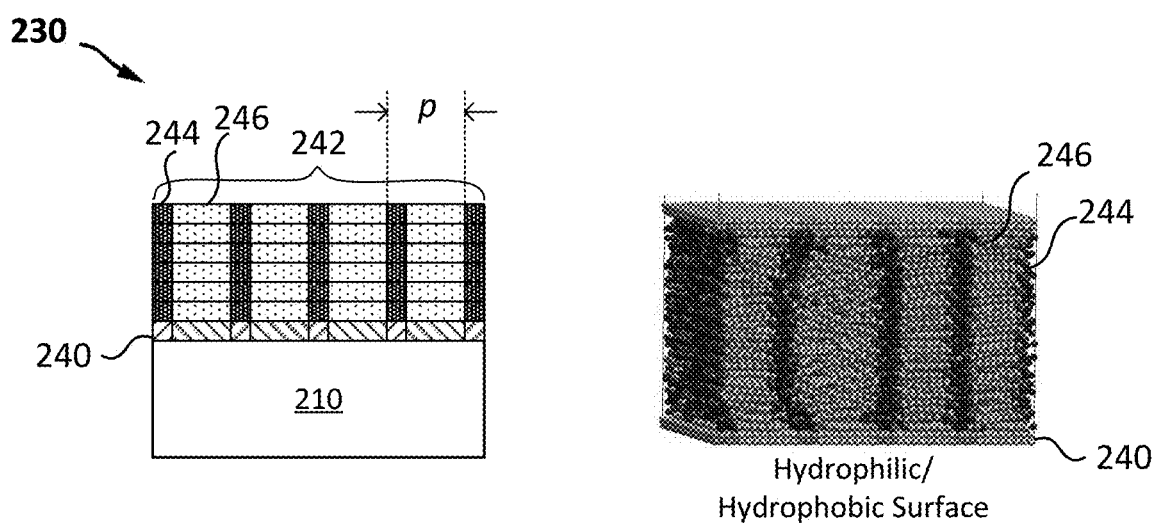
Figure 2C:
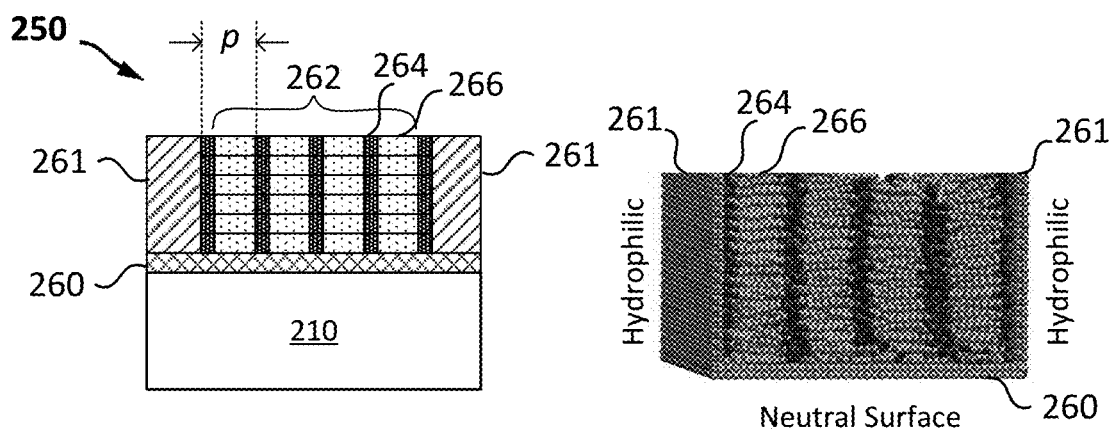

FIGS. 2(a)-(c) show coarse-grained (CG) simulation results of various lamellar structures formed by the direct self-assembly (DSA) of an example ILC (e.g., 1-dodecyl-3-methylimidazolium tetrafluoroborate). In the embodiment 200 shown in FIG. 2(a), a substrate 210 is provided with a hydrophilic surface layer 220. As shown in FIG. 2(a), self-assembly of the ILC on the hydrophilic surface layer 220 results in a horizontally layered structure 222 containing alternating horizontal layers of cation head groups 224 and interdigitated alkyl tail groups 226.

Vertically layered structures can be formed by assembling ILCs on other substrate surfaces, as shown in FIGS. 2(b) and 2(c). In the embodiment 230 shown in FIG. 2(b), the substrate 210 is provided with a periodic surface 240 comprising alternating hydrophilic and hydrophobic surface layers. As shown in FIG. 2(b), self-assembly of the ILC on the periodic surface 240 results in a vertically layered structure 242 containing alternating vertical layers of cation head groups 244 and interdigitated alkyl tail groups 246. In the embodiment 250 shown in FIG. 2(c), a feature formed on the substrate 210 is provided with a neutral bottom surface 260 and hydrophilic sidewalls 261. As shown in FIG. 2(c), self-assembly of the ILC within the feature results in a vertically layered structure 262 containing alternating vertical layers of cation head groups 264 and interdigitated alkyl tail groups 266.

As shown in FIGS. 2(a)-(c), the difference in polarity between the cation head groups 224/244/264 and alkyl tail groups 226/246/266 promote self-assembly of the ILC molecules and segregate the head and tail groups into lamellar structures, including both horizontal (FIG. 2(a)) and vertical (FIGS. 2(b)-(c)) orientations. As shown in FIGS. 2(b) and 2(c), the layer pitch (p) between the alternating layers of the vertically oriented lamellar structures is equal to the combined width of the head and tail groups of the self-assembled ILC molecules. Since the layer pitch (p) is much smaller than what is currently achievable with photolithography, the vertically layered structures shown in FIGS. 2(b) and 2(c) can be used as patterns for pitch multiplication, as long as the patterns can be successfully transferred to the underlying substrate 210. However, there are challenges involved in both forming the vertically layered patterns of ILCs and transferring the vertically layered patterns to the underlying substrate.

Figure 3:
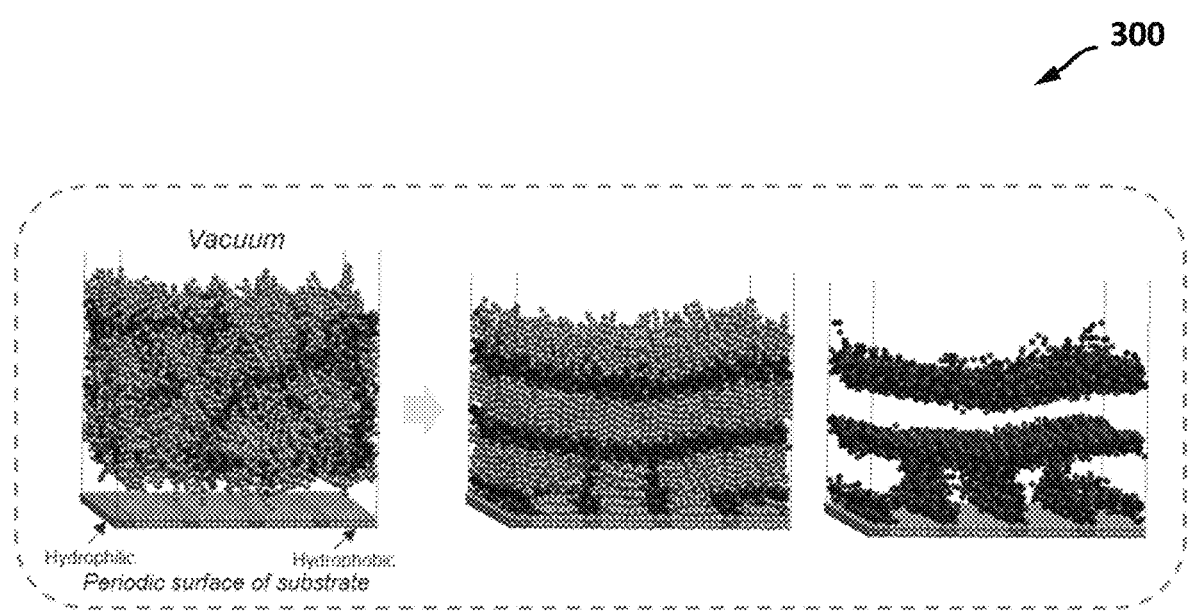
FIG. 3 is a course-grain simulation showing challenges faced when attempting to form vertically layered ILC structures on a periodic substrate surface in vacuum.

One method to form vertical layered patterns of ILCs involves depositing an ILC solution on a periodic substrate surface, as shown for example in FIG. 2(b), while exposing an upper surface of the ILC solution to vacuum. A course-grain simulation 300 is shown in FIG. 3 to illustrate the challenges faced when attempting to form vertically layered ILC structures on a periodic substrate surface in vacuum. As shown in FIG. 3, vertical patterns cannot propagate from the bottom to the top of an ILC film formed in vacuum due to the hydrophobic nature of the vacuum, which attracts the alkyl tail groups of the ILCs, causing them to face up at the interface. This leads to defective/distorted patterns of self-assembled ILCs on the substrate surface.

The embodiments described herein overcome the challenges faced when forming vertically layered ILC structures on a substrate surface by depositing the ILC solution in the presence of a gas phase, non-polar solvent. Since non-polar solvents are not attracted to the polar molecules (e.g., the cation head groups and anions) of the ILCs, exposing the ILC solution to a gas phase, non-polar solvent allows the ILC molecules to orient themselves into a vertically layered structure on the substrate surface.

The techniques described herein can be used to provide direct self-assembly (DSA) of ionic liquid crystals (ILCs) on a wide variety of substrate surfaces. In some embodiments, the techniques described herein may deposit an ILC solution on a periodic substrate surface, as shown for example in FIG. 2(b), while exposing an upper surface of the ILC solution to a gas phase, non-polar solvent. Unlike the course-grain simulation 300 shown in FIG. 3, exposing the ILC solution to a gas phase, non-polar solvent enables the ILC molecules within the ILC solution to orient themselves into a vertically layered structure on the periodic substrate surface. In other embodiments, the techniques described herein may be used to form vertical layered ILC structures within features (e.g., trenches, holes, etc.) having a neutral bottom surface and hydrophilic sidewalls, as shown in FIG. 2(c), by exposing an upper surface of the ILC solution to a gas phase, non-polar solvent while depositing the ILC solution within the features.

Figure 4:
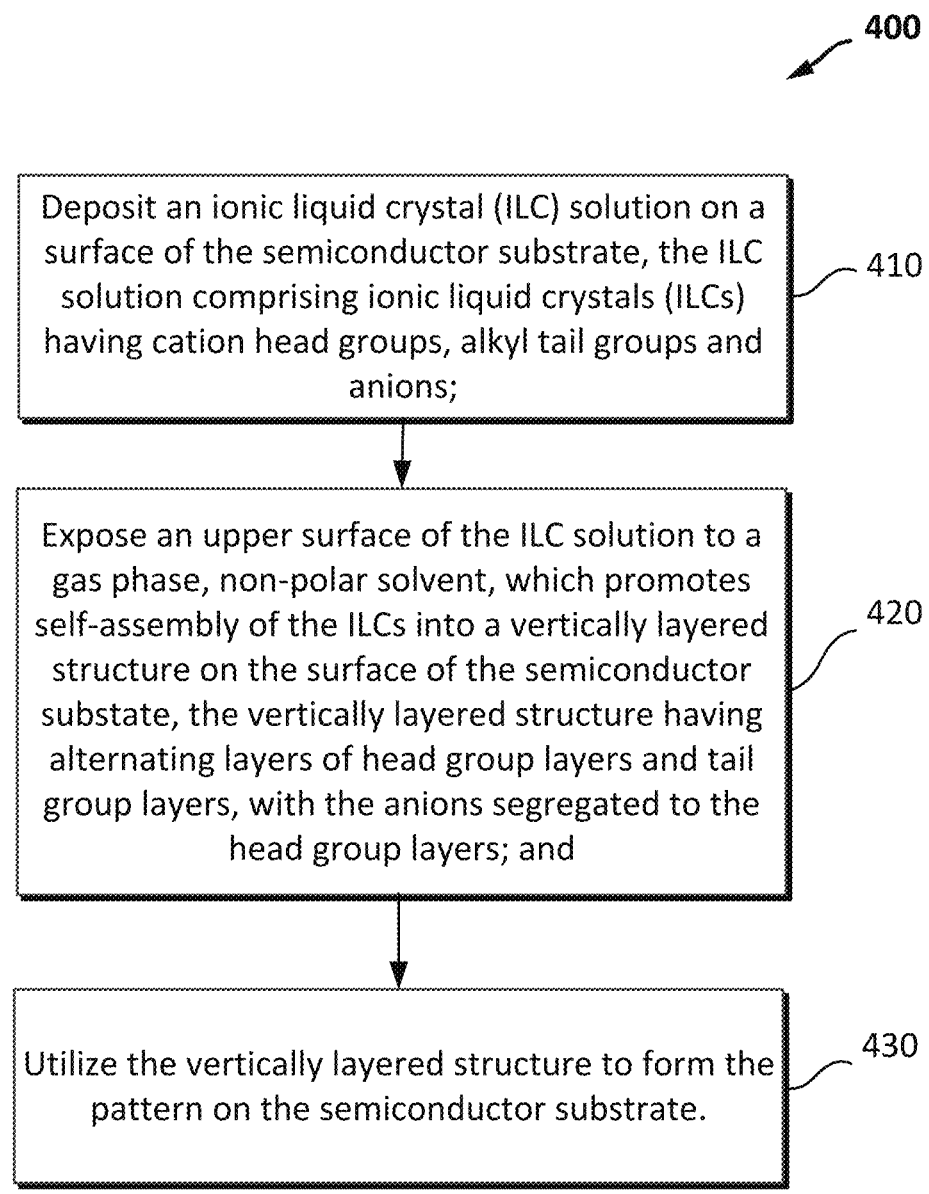
FIG. 4 is a flowchart diagram illustrating a method to form a pattern on a semiconductor substrate in accordance with one embodiment of the present disclosure.

FIG. 4 illustrates one embodiment of a method 400 that uses the techniques described herein to form a pattern on a semiconductor substrate. More specifically, the method 400 uses direct self-assembly (DSA) of ionic liquid crystals (ILCs) to form vertically layered ILC structures on a substrate surface. It will be recognized that the embodiment of the method 400 shown in FIG. 4 is merely exemplary and additional methods may utilize the techniques described herein. Further, additional processing steps may be added to the method 400 shown in FIG. 4 as the steps described are not intended to be exclusive. Moreover, the order of the steps is not limited to the order shown in the figure as different orders may occur and/or various steps may be performed in combination or at the same time.

The method 400 shown in FIG. 4 begins by depositing an ionic liquid crystal (ILC) solution on a surface of the semiconductor substrate (in step 410) and exposing an upper surface of the ILC solution to a gas phase, non-polar solvent (in step 420). The ILC solution deposited in step 410 includes ionic liquid crystals (ILCs) having cation head groups, alkyl tail groups and anions. By exposing the upper surface of the ILC solution to the gas phase, non-polar solvent in step 420, the non-polar solvent promotes self-assembly of the ILCs into a vertically layered structure on the surface of the semiconductor substate. The vertically layered structure has alternating layers of head group layers and tail group layers, with the anions segregated to the head group layers. After self-assembly, the method 400 utilizes the vertically layered structure to form the pattern on the semiconductor substrate (in step 430).

The ILCs included within the ILC solution may generally include a cation head group covalently bound to an alkyl tail group (e.g., a long-chain hydrocarbon) and an anion. Examples of cation head groups that may be included within the ILCs include, but are not limited to, imidazolium, pyrazolium, pyrrolidinium, pyridinium, piperidinium, morpholinium, ammonium, phosphonium, sulphonium or cholinium-based cation head groups. In some embodiments, the ILCs may include an imidazolium-based cation head group of the form: 1-$R_1$-3-$R_2$-imidazolium, where $R_1$ is an alkyl chain with a chain length ranging from 8-18 carbons, and $R_2$ is a hydrogen, methyl, ethyl, propyl, butyl, substituted or unsubstituted phenyl, or other hydrocarbon group. In example embodiments, the ILCs may be comprised of 1-dodecyl-3-methylimidazolium cations and an appropriate anion. A wide variety of anions can be used to form the ILCs.

Examples of anions that may be included within the ILCs include, but are not limited to, tetrafluoroborate ($BF_4^-$), chloride ($Cl^-$), acetate ($CH_3COO^-$), hexafluorophosphate ($PF_6^-$), trifluoromethyl acetate ($C_3H_3F_3O_2^-$), nitrate ($NO_3^-$), dicyanamide ($C_2HN_3^-$), tetracyanoborate ($B(CN)_4^-$), trifluoromethane sulfonate ($CF_3O_3S^-$) and bis((trifluoromethyl)sulfonyl)imdide ($[(CF_3SO_2)_2N]^-$). 1-dodecyl-3-methylimidazolium tetrafluoroborate is one example of an ILC that contains an imidazolium-based cation head group and a tetrafluoroborate ($BF_4^-$) anion. However, other ILCs having other cations and/or anions can also be included within the ILC solution.

In some embodiments, metalate anions may be used in place of the anions mentioned above to form metalate salt ILCs. In addition to preserving the self-assembly properties of the ILCs, the metalate anion enables a new method of pattern transfer after the metalate salt ILCs self-assemble into a desired layered structure (e.g., a vertically oriented or horizontally oriented lamellar structure).

As known in the art, a metalate anion (or "metalate") is a complex anion containing a metal ligated to several atoms or small groups. A metalate anion can include any metal and a wide variety of ligands. Examples of metals that may be included within a metalate anion include transition metals (such as, e.g., iron (Fe), copper (Cu), cobalt (Co), Zinc (Zn), Cadmium (Cd), etc.), post-transition metals (such as, e.g., aluminum (Al), indium (In), tin (Sn), lead (Pb), bismuth (Bi), etc.) and lanthanides (such as, e.g., cerium (Ce), neodymium (Nd), samarium (Sm), etc.). Examples of ligands that may be included within a metalate anion include oxo, halo, cyano (CN), thiocyano (SCN), nitrato, sulfato, phosphato, phosphine, trifluoromethane sulfonate, sulfo and carbonato ligands.

In some embodiments, a chlorometalate anion may be used as the metalate anion. Examples of chlorometalate anions that may be used to form metalate salt ILCs include, but are not limited to, chloroaluminate anions (such as, e.g., $[AlCl_4]^-$, $[Al_2Cl_7]^-$, $[Al_3Cl_{10}]^-$, $[Al_4Cl_{13}]^-$, etc.), chloroferrate anions (such as, e.g., $Cl_4Fe^-$), chlorostannate anions (such as, e.g., $[SnCl_3]^-$, $[Sn_2Cl_5]^-$, etc.), chloroindate anions (such as, e.g., $[InCl_6]^{3-}$, $([InCl_5]^{2-}$, $[InCl_4]^-$, etc.), and chlorozincate anions (such as, e.g., $[ZnCl_4]^{2-}$, $[Zn_2Cl_6]^{2-}$, $[Zn_3Cl_8]^{2-}$, etc.).

Ionic liquid crystals (including metalate salt ILCs) self-assemble into solid (crystalline phase) ordered structures at or near room temperature. The difference in polarity between the cation head groups and the alkyl tail groups promote direct self-assembly of the ILC molecules by segregating the head and tail groups into ordered structures, with the anions segregating to the head group layers. In some embodiments, the head and tail groups may be segregated into layered structures (or "lamellar structures") having either a horizontal or vertical orientation. The orientation of the layered structures and the pitch between the layers (i.e., the layer pitch) can be controlled by controlling the chain length of the alky tail groups, the deposition temperature and the hydrophobicity of the surface(s) upon which the ILCs are deposited.

The chain length of the alkyl tail groups may range between 8-18 hydrocarbon molecules, depending on the ILCs used within the ILC solution. In some embodiments, the method 400 may utilize an ILC with a longer alkyl chain length to increase the layer pitch, or an ILC with a smaller alkyl chain length to decrease the layer pitch. For 1-dodecyl-3-methylimidazolium-based ILCs, the layer pitch may be approximately 3 nm.

Since ILCs self-assemble into solid (crystalline phase) ordered structures at or near room temperature, rearrangement of the ILCs into layered structures is preferably performed above room temperature. In some embodiments, the ILC solution containing the ILCs may be dispensed at a temperature above the melting point of the ILCs. After depositing the ILC solution on the surface of the semiconductor substrate (in step 410), the substrate may be cooled to promote self-assembly of the ILCs and solidify the ILC film. In other embodiments, the method 400 may expose the upper surface of the ILC solution to the gas phase, non-polar solvent (in step 420) while maintaining a relatively high temperature (e.g., a substrate temperature or ambient temperature above the melting point of the ILCs) and gas pressure (e.g., a gas pressure between about 2 to 3 atmospheres) within the deposition chamber. The relatively high gas pressure enables the ILC molecules to self-assemble into vertically layered structures. The relatively high temperature prevents crystallization of the ILCs before the ILC molecules rearrange themselves into the vertically layered structures on the substrate surface. After deposition and exposure to the gas phase, non-polar solvent, the substrate (and/or the ambient) may be cooled to promote self-assembly of the ILCs and solidify the ILC film.

Figure 5A:
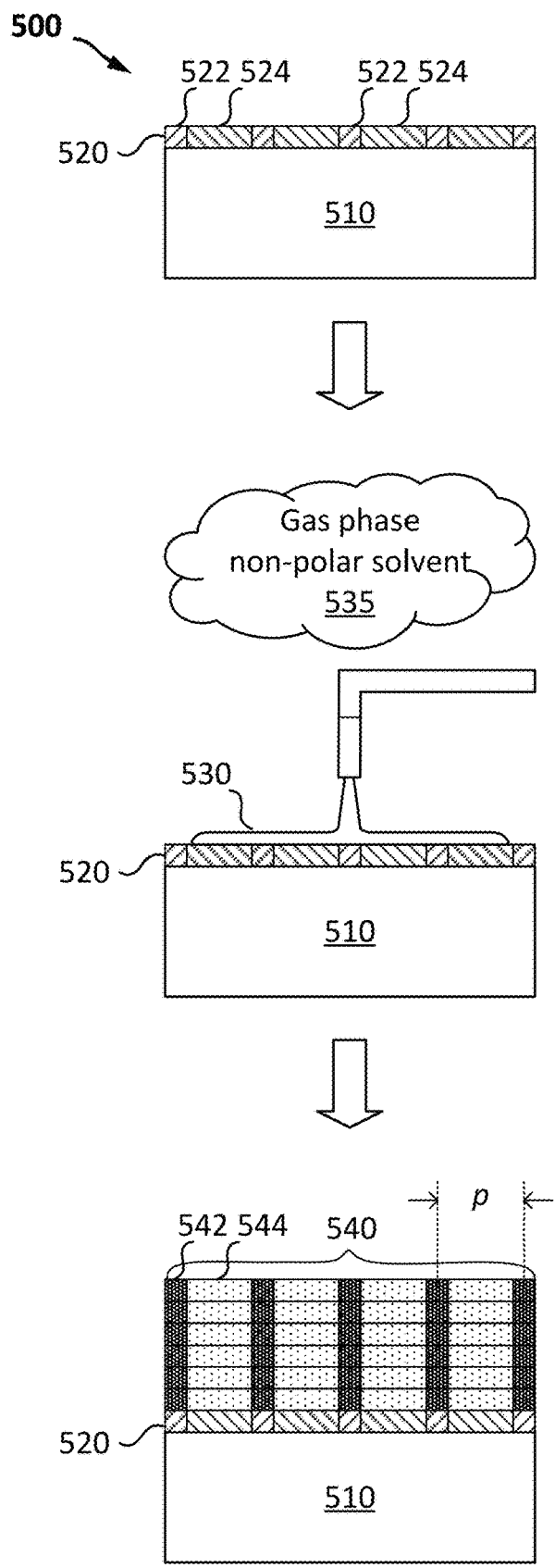
FIG. 5A is a block diagram illustrating an example process flow that uses the method shown in FIG. 4 to form vertically layered ILC structures on a periodic substrate surface.
Figure 5B:
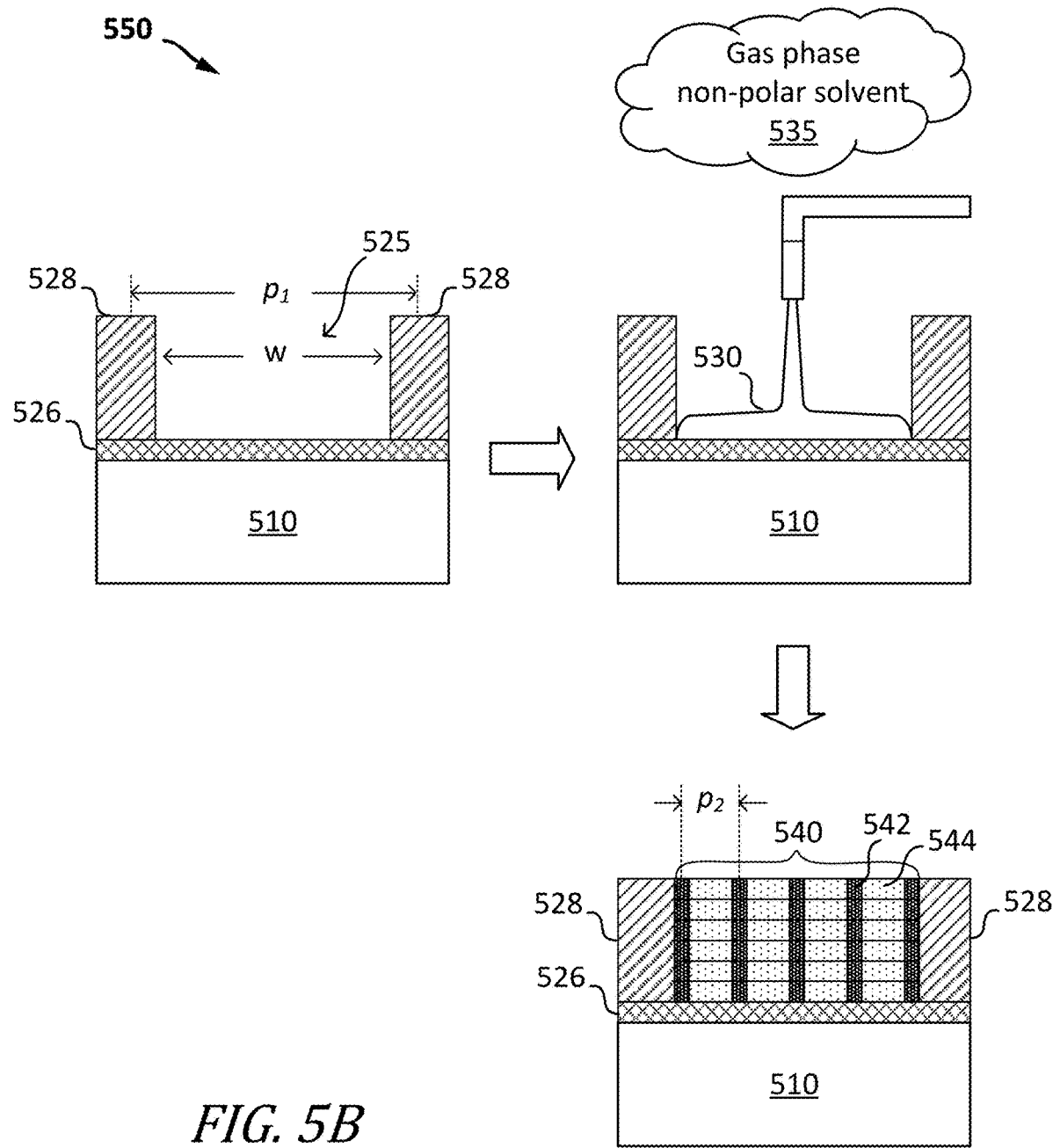
FIG. 5B is a block diagram illustrating another example process flow that uses the method shown in FIG. 4 to form vertically layered ILC structures within a feature having a neutral bottom surface and hydrophilic sidewall surfaces.

As noted above with regard to FIGS. 2(a)-(c), the orientation of the layered structures and the pitch between the layers (i.e., the layer pitch) is highly influenced by the hydrophobicity of the guide surfaces, such as the underlying substrate surface and/or sidewalls of the larger template pattern, upon which the ILC solution is deposited. FIGS. 5A and 5B illustrate an example process flows that use the method 400 shown in FIG. 4 to form vertically layered ILC structures on various guide surfaces.

For example, the process flow 500 shown in FIG. 5A uses the method 400 shown in FIG. 4 to form vertically layered ILC structures on a periodic substrate surface. The process flow 500 shown in FIG. 5A begins by providing a semiconductor substrate 510 having a periodic substrate surface 520, which includes alternating layers of hydrophilic surface layers 522 and hydrophobic surface layers 524. An ILC solution 530 is dispensed onto the periodic substrate surface 520 while an upper surface of the ILC solution 530 is exposed to a gas phase, non-polar solvent 535 at a predetermined gas pressure (e.g., a gas pressure between about 2 to 3 atmospheres). As described in more detail below, the gas phase, non-polar solvent 535 provides an ambient environment, which enables the ILCs within the ILC solution 530 to self-assemble into a vertically layered structure 540 on the periodic substrate surface 520.

In some embodiments, spin coating may be used to deposit the ILC solution 530 on the periodic substrate surface 520. Thin layers of ILCs can be achieved by dissolving the ILCs in an appropriate solvent and dispensing the ILC solution over the substrate surface. The choice of solvent generally depends on the ILCs included within the ILC solution 530. For 1-dodecyl-3-methylimidazolium-based ILCs, for example, the solvent can include alcohols (such as, e.g., methanol, isopropyl alcohol (IPA), etc.), ethers, acetates (such as, e.g., ethyl acetate, acetone, etc.), water, hexane, toluene, acetonitrile and other organic solvents. The final thickness of the ILC film can be controlled by adjusting the wet film thickness during spin coating and the concentration of the ILCs in solution. By using dilute solutions of ILCs, very thin ILC films can be achieved once the solvent has evaporated.

The upper surface of the ILC solution 530 may be exposed to a wide variety of gas phase, non-polar solvents. In some embodiments, for example, the upper surface of the ILC solution 530 may be exposed to hexane ($C_6H_{14}$) gas, cyclohexane ($C_6H_{12}$) gas, pentane ($C_5H_{12}$) gas, heptane ($C_7H_{16}$) gas or another gas phase alkane. In other embodiments, the upper surface of the ILC solution 530 may be exposed to benzene ($C_6H_6$) gas, toluene ($C_6H_5CH_3$) gas, xylene ($C_8H_{10}$) gas or another gas phase aromatic hydrocarbon. Other gas phase, non-polar solvents not specifically mentioned herein may also be used.

Because the gas phase, non-polar solvent 535 is not attracted to the polar molecules of the ILCs, the gas phase, non-polar solvent 535 provides an ambient environment that promotes self-assembly of the ILCs into a vertically layered structure 540 having alternating layers of head group layers 542 and tail group layers 544, with the anions segregated to the head group layers 542. In the embodiment shown in FIG. 5A, the ambient environment provided by the gas phase, non-polar solvent 535 enables: (a) the head group layers 542 to vertically align with the hydrophilic surface layers 522 of the periodic substrate surface 520, and (b) the tail group layers 544 to vertically align with the hydrophobic surface layers 524 of the periodic substrate surface 520.

The process flow 500 shown in FIG. 5A enables ILCs deposited on a periodic substrate surface 520 to self-assemble into a vertically layered structure 540 by providing an ambient environment that promotes self-assembly. In some embodiments, the temperature of the ILC solution 530 and/or the temperature within the deposition chamber may be elevated above the melting point of the ILCs to allow the ILCs to self-assemble into the vertically layered structure 540 before the substrate (and/or the ambient) is cooled to solidify the ILC film. In some embodiments, an annealing step may be performed after self-assembly to assist in the formation of the vertically layered structure 540.

The process flow 500 shown in FIG. 5A utilizes direct self-assembly (DSA) of ILCs to form vertically layered ILC structures on a periodic substrate surface 520. As shown in FIG. 5A, the layer pitch (p) between the alternating layers of the vertically layered structure 540 is equivalent to the combined width of the head group layers 542 and tail group layers 544 of the self-assembled ILCs and is generally dependent on the chain length of the alkyl tail groups. In some embodiments, the layer pitch (p) between the alternating layers of the vertically layered structure 540 may be approximately 3 nm when 1-dodecyl-3-methylimidazolium-based ILCs (which have 12 hydrocarbon molecules) are used to form the vertically layered ILC structures.

FIG. 5B illustrates another process flow 550 that uses the method 400 shown in FIG. 4 to form vertically layered ILC structures within features (such as, e.g., trenches, holes, etc.) formed on a semiconductor substrate. The process flow 550 shown in FIG. 5B begins by providing a semiconductor substrate 510 having at least one feature 525 formed thereon. An ILC solution 530 is dispensed within the feature 525 while an upper surface of the ILC solution 530 is exposed to a gas phase, non-polar solvent 535 at a predetermined gas pressure (e.g., a gas pressure between about 2 to 3 atmospheres). As described above, the gas phase, non-polar solvent 535 provides an ambient environment, which enables the ILCs within the ILC solution 530 to self-assemble into a vertically layered structure 540 within the feature 525.

In some embodiments, the feature 525 may be formed by: (a) depositing a neutral layer 526 on the semiconductor substrate 510, (b) depositing a hydrophilic layer on the neutral layer 526, and (c) using a photolithography process to form the feature 525 within the hydrophilic layer. For example, a photolithography process comprising resist coating, exposure, bake and develop/etch steps may be used to form the feature 525 within the hydrophilic layer, thereby forming a pattern of hydrophilic lines 528 on the neutral layer 526 at a first pitch ($p_1$). In some embodiments, the first pitch ($p_1$) may be greater than approximately 28 nm when extreme ultra-violet (EUV) lithography is used to form the pattern of hydrophilic lines 528. In the embodiment shown in FIG. 5B, the feature 525 has a neutral bottom surface and hydrophilic sidewall surfaces. In order to enable vertically aligned layering of the ILCs in the next process step, the width (w) of the feature 525 is chosen to be an integer multiple of a layer pitch ($p_2$) between the alternating layers of the vertically layered structure 540 subsequently formed within the feature 525.

Like the previous embodiment shown in FIG. 5A, spin coating may be used to deposit the ILC solution 530 within the feature 525. Thin layers of ILCs can be achieved by dissolving the ILCs in an appropriate solvent (e.g., an organic solvent) and dispensing the ILC solution over the substrate surface. The final thickness of the ILC film can be controlled by adjusting the wet film thickness during spin coating and the concentration of the ILCs in solution. By using dilute solutions of ILCs, very thin ILC films can be achieved once the solvent has evaporated. Ideally, the spin coating step may fill the feature 525 formed during the photolithography process with the ILC solution, while the tops of the hydrophilic lines 528 remain free of ILCs.

Like the previous embodiment shown in FIG. 5A, the upper surface of the ILC solution 530 may be exposed to a wide variety of gas phase, non-polar solvents including, but not limited to, hexane ($C_6H_{14}$) gas, cyclohexane ($C_6H_{12}$) gas, pentane ($C_5H_{12}$) gas, heptane ($C_7H_{16}$) gas, benzene ($C_6H_6$) gas, toluene ($C_6H_5CH_3$) gas, xylene ($C_8H_{10}$) gas and other gas phase alkanes and aromatic hydrocarbons. Because the gas phase, non-polar solvent 535 is not attracted to the polar molecules of the ILCs, the gas phase, non-polar solvent 535 provides an ambient environment that promotes self-assembly of the ILCs into a vertically layered structure 540 having alternating layers of head group layers 542 and tail group layers 544, with the anions segregated to the head group layers 542. In the embodiment shown in FIG. 5B, the ambient environment provided by the gas phase, non-polar solvent 535 enables the head group layers 542 to orient themselves towards the hydrophilic sidewall surfaces of the feature 525.

The process flow 550 shown in FIG. 5B enables ILCs deposited within a feature 525 (e.g., a trench, hole, etc.) to self-assemble into a vertically layered structure 540 by providing an ambient environment that promotes self-assembly. In some embodiments, the temperature of the ILC solution 530 and/or the temperature within the deposition chamber may be elevated above the melting point of the ILCs to allow the ILCs to self-assemble into the vertically layered structure 540 before the substrate (and/or the ambient) is cooled to solidify the ILC film. In some embodiments, an annealing step may be performed after self-assembly to assist in the formation of the vertically layered structure 540.

The process flow 550 shown in FIG. 5B utilizes direct self-assembly (DSA) of ILCs to form vertically layered ILC structures within a feature 525 having a neutral bottom surface and hydrophilic sidewall surfaces. In the embodiment shown in FIG. 5B, the layer pitch ($p_2$) between the alternating layers of the vertically layered structures 540 is: (a) equivalent to the combined width of the head and tail group layers, and (b) an integer divisor (e.g., 4) of the width (w) of the feature 525. This spacing enables the head and tail group layers of the ILCs to vertically align within the feature 525.

Figure 6:
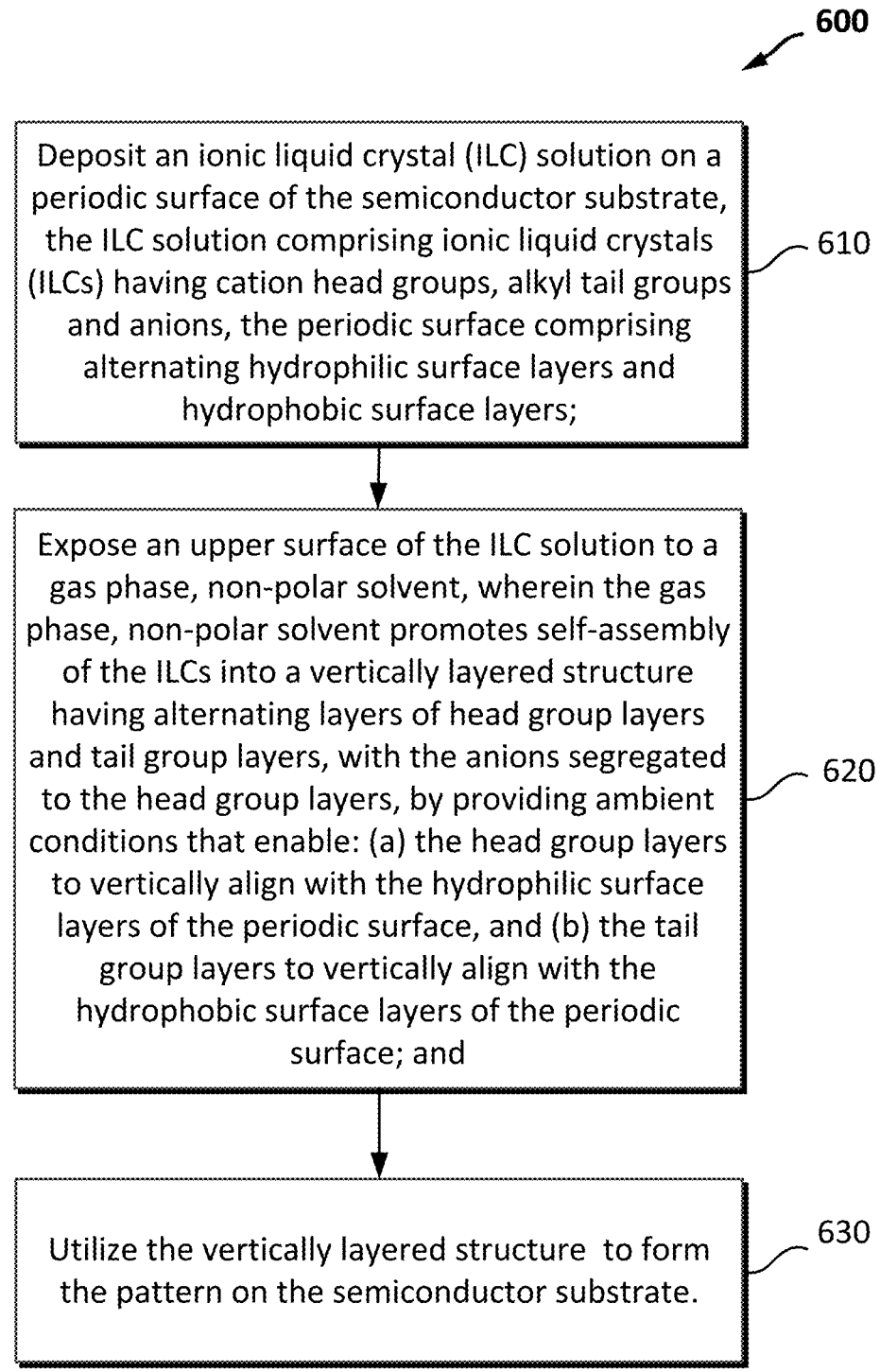
FIG. 6 is a flowchart diagram illustrating a method to form a pattern on a semiconductor substrate in accordance with another embodiment of the present disclosure.

FIG. 6 illustrates one embodiment of a method 600 that uses the techniques described herein to pattern a semiconductor substrate. More specifically, the method 600 uses direct self-assembly (DSA) of ionic liquid crystals (ILCs) to form vertically layered ILC structures on a periodic substrate surface. It will be recognized that the embodiment of the method 600 shown in FIG. 6 is merely exemplary and additional methods may utilize the techniques described herein. Further, additional processing steps may be added to the method 600 shown in FIG. 6 as the steps described are not intended to be exclusive. Moreover, the order of the steps is not limited to the order shown in the figure as different orders may occur and/or various steps may be performed in combination or at the same time.

The method 600 shown in FIG. 6 begins by depositing an ionic liquid crystal (ILC) solution on a periodic surface of the semiconductor substrate (in step 610) and exposing an upper surface of the ILC solution to a gas phase, non-polar solvent (in step 620). The ILC solution deposited in step 610 includes ionic liquid crystals (ILCs) having cation head groups, alkyl tail groups and anions. The periodic surface upon which the ILC solution is deposited includes alternating hydrophilic surface layers and hydrophobic surface layers, as shown for example in FIG. 5A and discussed above.

The ILC solution deposited in step 610 may include a wide variety of ILCs. In some embodiments, the ILCs may include an imidazolium-based cation head group covalently bound to an alkyl tail group and anion. In some embodiments, the ILCs may include an imidazolium-based cation head group of the form: 1-$R_1$-3-$R_2$-imidazolium, where $R_1$ is an alkyl chain with a chain length ranging from 8-18 carbons, and $R_2$ is a hydrogen, methyl, ethyl, propyl, butyl, substituted or unsubstituted phenyl, or other hydrocarbon group. In example embodiments, the ILCs may be synthesized by combining 1-dodecyl-3-methylimidazolium-based ILCs with an appropriate anion. A wide variety of anions can be used to form the ILCs, as discussed further above.

After depositing the ILC solution on the periodic surface (in step 610), the method 600 exposes the upper surface of the ILC solution to a gas phase, non-polar solvent (in step 620). The gas phase, non-polar solvent promotes self-assembly of the ILCs into a vertically layered structure having alternating layers of head group layers and tail group layers, with the anions segregated to the head group layers, by providing an ambient environment that enables: (a) the head group layers to vertically align with the hydrophilic surface layers of the periodic surface, and (b) the tail group layers to vertically align with the hydrophobic surface layers of the periodic surface. After self-assembly, the method 600 may utilize the vertically layered structure to form a pattern on the semiconductor substrate (in step 630).

Figure 7:
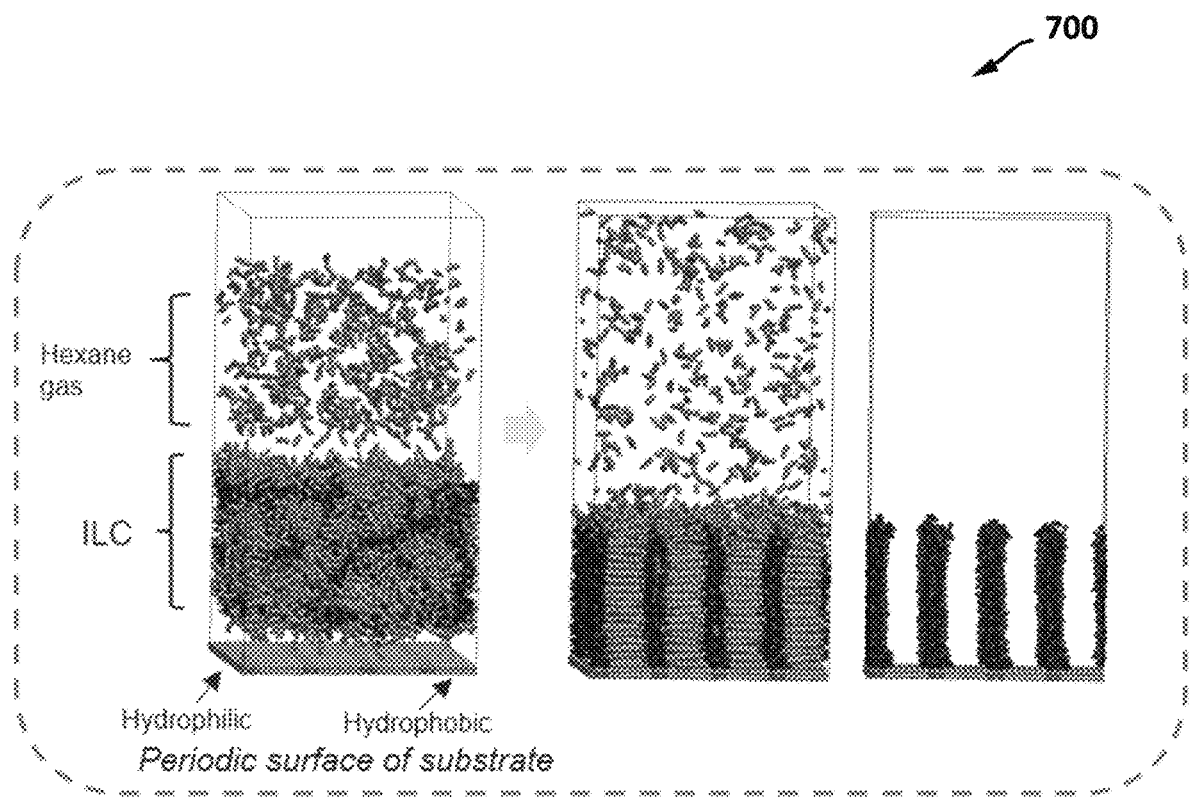
FIG. 7 is a course-grain simulation illustrating how a gas phase, non-polar solvent (such as hexane gas) can be used to promote self-assembly of ILCs into a vertically layered ILC structure on a periodic surface.

A course-grain simulation 700 is shown in FIG. 7 to illustrate how a gas phase, non-polar solvent (such as hexane gas) can be used to promote self-assembly of ILCs into a vertically layered ILC structure on a periodic surface. As shown in FIG. 7, the gas phase, non-polar solvent provides an ambient environment, which neither attracts nor repels the polar molecules of the ILCs. This enables the ILCs to orient themselves into a vertically layered structure on the periodic surface, such that: (a) the head group layers and anions are vertically aligned with the hydrophilic surface layers of the periodic surface, and (b) the tail group layers are vertically aligned with the hydrophobic surface layers of the periodic surface.

FIGS. 4-7 provide various embodiments of methods and process flows to form vertically layered ILC structures on various substrate surfaces. The disclosed embodiments improve upon conventional process flows and methods that utilize molecular self-assembly by exposing an ILC solution to a gas phase, non-polar solvent (such as, e.g., hexane gas). As noted above, the gas phase, non-polar solvent provides an ambient environment that promotes self-assembly of the ILCs into a vertically layered ILC structure.

As noted above, forming a vertically layered ILC structure on a substrate surface is only one challenge that must be overcome to enable self-assembled ILCs to be used for pattern transfer. After a vertically layered pattern of self-assembled ILCs is formed on a substrate surface using the techniques described herein, additional challenges must be overcome to successfully transfer the vertically layered pattern to an underlying surface. For example, removing the alkyl tail groups from the ILC film leaves an ionic liquid on the substrate surface. On the other hand, removing the cation head group from the ILC film leaves the alkyl tail groups, which are also liquid at room temperature. The remaining group (e.g., the anion) within the ILC film is mobile in both of these options, so no patterning information will be maintained if one or more groups of the self-assembled ILC is removed.

Co-pending U.S. patent application Ser. No. 18/388,222, entitled "Methods for Patterning a Semiconductor Substrate Using Metalate Salt Ionic Liquid Crystals," overcomes the challenges faced when transferring the patterning information of self-assembled ILCs to an underlying substrate. The co-pending application discloses various methods to pattern a semiconductor substrate using direct self-assembly of metalate salt ILCs followed by oxidation of the self-assembled metalate salt ILC film to produce a robust metal oxide pattern, which can be transferred to an underlying layer of a semiconductor substrate.

As noted in the co-pending application and described above, metalate salt ILCs can be synthesized by dissolving stoichiometric amounts of metal halides in imidazolium-based ILCs with a halide anion. A wide variety of metal halides and halide anions can be combined with imidazolium-based ILCs to synthesize metalate salt ILCs. For example, aluminum chloride ($AlCl_3$) can be dissolved in 1-docecyl-3-methylimidazolium chloride to form 1-dodecyl-3-methylimidazolium tetrachloroaluminate. The metalate salt ILCs formed in such synthesis contain an imidazolium-based cation head group covalently bound to an elongated alkyl tail group and metalate anion (e.g., tetrachloroaluminate ($AlCl_4^-$)). Other metalate salt ILCs may be formed by dissolving other metal halides in ionic liquid crystal (ILC) halide salts.

Similar to other ILCs, metalate salt ILCs can self-assemble into solid (crystalline phase) ordered structures at or near room temperature. The difference in polarity between the cation head groups and the alkyl tail groups promote direct self-assembly of the metalate salt ILC molecules by segregating the head and tail groups into layered structures (or "lamellar structures") with the metalate anions segregated to the head group layers. Similar to other ILCs, the orientation of the self-assembled metalate salt ILCs and the layer pitch can be controlled by controlling the chain length of the alky tail groups, the deposition temperature and the hydrophobicity of the surface(s) upon which the metalate salt ILCs are deposited. For 1-dodecyl-3-methylimidazolium-based metalate salt ILCs, the layer pitch may be approximately 3 nm.

After self-assembly, an oxidation process (e.g., an oxygen plasma ashing, ultra-violet (UV) ozone, gas phase oxidation or solution phase oxidation process) can be used to oxidize the metalate salt ILC film and form a more robust pattern that can be transferred to the underlying substrate. The oxidation process removes the alkyl tail group layers from the vertically layered ILC structures by converting the organic material within the alkyl tail group layers into volatile carbon oxides, which are removed from the substrate surface during the oxidation process. However, the metalate anions within the head group layers are converted into non-volatile metal oxides, which are left on the substrate surface after oxidation. In doing so, the oxidation process volatizes the ionic liquid crystal layer, but leaves behind a metal oxide pattern where the metalate anions were concentrated. The metal oxide pattern left on the substrate surface is more robust than the ILC film, and as such, can be used as a hard mask for pattern transfer to underlying layer(s).

The present disclosure provides various embodiments of improved process flows and methods to form vertically layered ILC structures on various substrate surfaces. In the disclosed embodiments, an ILC solution is exposed to a gas phase, non-polar solvent (such as, e.g., hexane gas) at a predetermined gas pressure (e.g., a gas pressure between about 2 to 3 atmospheres) to provide an ambient environment that promotes self-assembly of ILCs into vertically layered ILC structures. In some embodiments, the techniques described herein may be combined with those described in the co-pending application to provide a more robust metal oxide pattern that can be transferred to an underlying substrate.

The term "semiconductor substrate" or "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The substrate may also include any material portion or structure of a device, particularly a semiconductor or other electronics device, and may, for example, be a base substrate structure, such as a semiconductor substrate or a layer on or overlying a base substrate structure. Thus, the term "substrate" is not intended to be limited to any particular base structure, underlying layer or overlying layer, patterned layer or unpatterned layer, but rather, is contemplated to include any such layer or base structure, and any combination of layers and/or base structures.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the methods described herein will be apparent to those skilled in the art in view of this description. It will be recognized, therefore, that the described methods are not limited by these example arrangements. It is to be understood that the forms of the methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method to form a pattern on a semiconductor substrate, the method comprising:
    depositing an ionic liquid crystal (ILC) solution on a surface of the semiconductor substrate, the ILC solution comprising ionic liquid crystals (ILCs) having cation head groups, alkyl tail groups and anions;
    exposing an upper surface of the ILC solution to a gas phase, non-polar solvent, which promotes self-assembly of the ILCs into a vertically layered structure on the surface of the semiconductor substate, the vertically layered structure having alternating layers of head group layers and tail group layers, with the anions segregated to the head group layers; and
    utilizing the vertically layered structure to form the pattern on the semiconductor substrate.

2. The method of claim 1, wherein said depositing the ILC solution comprises depositing the ILC solution on a periodic substrate surface comprising alternating hydrophilic surface layers and hydrophobic surface layers.

3. The method of claim 2, wherein the gas phase, non-polar solvent enables the ILCs to self-assemble into the vertically layered structure on the periodic substrate surface with the head group layers and anions vertically aligned with the hydrophilic surface layers and the tail group layers vertically aligned with the hydrophobic surface layers.

4. The method of claim 1, wherein said depositing the ILC solution comprises depositing the ILC solution within at least one feature formed on the semiconductor substrate, the at least one feature having a neutral bottom surface and hydrophilic sidewall surfaces.

5. The method of claim 4, wherein the gas phase, non-polar solvent enables the ILCs to self-assemble into the vertically layered structure within the at least one feature, wherein the head group layers of the vertically layered structures are oriented towards the hydrophilic sidewall surfaces of the at least one feature.

6. The method of claim 1, wherein the cation head groups within the ILCs comprise an imidazolium, pyrazolium, pyrrolidinium, pyridinium, piperidinium, morpholinium, ammonium, phosphonium, sulphonium or cholinium based cation head group.

7. The method of claim 1, wherein the ILCs comprise an imidazolium-based cation head group of the form: 1-$R_1$-3-$R_2$-imidazolium, where $R_1$ is an alkyl chain with a chain length ranging from 8-18 carbons, and $R_2$ is a hydrogen, methyl, ethyl, propyl, butyl, substituted or unsubstituted phenyl, or other hydrocarbon group.

8. The method of claim 7, wherein the anions within the ILCs comprise tetrafluoroborate ($BF_4^-$), chloride ($Cl^-$), acetate ($CH_3COO^-$), hexafluorophosphate ($PF_6^-$), trifluoromethyl acetate ($C_3H_3F_3O_2^-$), nitrate ($NO_3^-$), dicyanamide ($C_2HN_3^-$), tetracyanoborate ($B(CN)_4^-$), trifluoromethane sulfonate ($CF_3O_3S^-$) or bis((trifluoromethyl)sulfonyl)imdide ($[(CF_3SO_2)_2N]^-$).

9. The method of claim 7, wherein the anions within the ILCs comprise chloroaluminate anions, chloroferrate anions, chlorostannate anions, chloroindate anions or chlorozincate anions.

10. The method of claim 1, wherein the gas phase, non-polar solvent comprises hexane ($C_6H_{14}$), cyclohexane ($C_6H_{12}$), pentane ($C_5H_{12}$), heptane ($C_7H_{16}$) or another gas phase alkane.

11. The method of claim 1, wherein the gas phase, non-polar solvent comprises benzene ($C_6H_6$), toluene ($C_6H_5CH_3$), xylene ($C_8H_{10}$) or another gas phase aromatic hydrocarbon.

12. A method to form a pattern on a semiconductor substrate, the method comprising:
depositing an ionic liquid crystal (ILC) solution on a periodic surface of the semiconductor substrate, the ILC solution comprising ionic liquid crystals (ILCs) having cation head groups, alkyl tail groups and anions, the periodic surface comprising alternating hydrophilic surface layers and hydrophobic surface layers;
exposing an upper surface of the ILC solution to a gas phase, non-polar solvent, wherein the gas phase, non-polar solvent promotes self-assembly of the ILCs into a vertically layered structure having alternating layers of head group layers and tail group layers, with the anions segregated to the head group layers, by providing an ambient environment that enables: (a) the head group layers to vertically align with the hydrophilic surface layers of the periodic surface, and (b) the tail group layers to vertically align with the hydrophobic surface layers of the periodic surface; and
utilizing the vertically layered structure to form the pattern on the semiconductor substrate.

13. The method of claim 12, wherein the cation head groups within the ILCs comprise an imidazolium, pyrazolium, pyrrolidinium, pyridinium, piperidinium, morpholinium, ammonium, phosphonium, sulphonium or cholinium based cation head group.

14. The method of claim 12, wherein the ILCs comprise an imidazolium-based cation head group of the form: 1-$R_1$-3-$R_2$-imidazolium, where $R_1$ is an alkyl chain with a chain length ranging from 8-18 carbons, and $R_2$ is a hydrogen, methyl, ethyl, propyl, butyl, substituted or unsubstituted phenyl, or other hydrocarbon group.

15. The method of claim 14, wherein the anions within the ILCs comprise tetrafluoroborate ($BF_4^-$), chloride ($Cl^-$), acetate ($CH_3COO^-$), hexafluorophosphate ($PF_6^-$), trifluoromethyl acetate ($C_3H_3F_3O_2^-$), nitrate ($NO_3^-$), dicyanamide ($C_2HN_3^-$), tetracyanoborate ($B(CN)_4^-$), trifluoromethane sulfonate ($CF_3O_3S^-$) or bis((trifluoromethyl)sulfonyl)imdide ($[(CF_3SO_2)_2N]^-$).

16. The method of claim 14, wherein the anions within the ILCs comprise chloroaluminate anions, chloroferrate anions, chlorostannate anions, chloroindate anions or chlorozincate anions.

17. The method of claim 16, wherein said utilizing the vertically layered structure to form the pattern on the semiconductor substrate comprises exposing the semiconductor substrate to an oxidization process to remove the tail group layers from the vertically layered structure and convert the head group layers of the vertically layered structure into a metal oxide pattern.

18. The method of claim 17, wherein said exposing the semiconductor substrate to the oxidization process comprises exposing the semiconductor substrate to an oxygen plasma ashing process, an ultra-violet (UV) ozone process, a gas phase oxidation process or a solution phase oxidation process.

19. The method of claim 12, wherein the gas phase, non-polar solvent comprises hexane ($C_6H_{14}$), cyclohexane ($C_6H_{12}$), pentane ($C_5H_{12}$), heptane ($C_7H_{16}$) or another gas phase alkane.

20. The method of claim 12, wherein the gas phase, non-polar solvent comprises benzene ($C_6H_6$), toluene ($C_6H_5CH_3$), xylene ($C_8H_{10}$) or another gas phase aromatic hydrocarbon.

* * * * *